(12) United States Patent
Moriya et al.

(10) Patent No.: US 8,980,028 B2
(45) Date of Patent: Mar. 17, 2015

(54) METAL BASE SUBSTRATE AND MANUFACTURING METHOD THEREOF

(71) Applicant: Murata Manufacturing Co., Ltd., Nagaokakyo-shi, Kyoto-fu (JP)

(72) Inventors: Yoichi Moriya, Nagaokakyo (JP); Tsuyoshi Katsube, Nagaokakyo (JP); Yuki Takemori, Nagaokakyo (JP); Tetsuo Kanamori, Nagaokakyo (JP); Yasutaka Sugimoto, Nagaokakyo (JP); Takahiro Takada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 236 days.

(21) Appl. No.: 13/630,049

(22) Filed: Sep. 28, 2012

(65) Prior Publication Data
US 2013/0264723 A1 Oct. 10, 2013

Related U.S. Application Data

(63) Continuation of application No. PCT/JP2011/056913, filed on Mar. 30, 2011.

(30) Foreign Application Priority Data

Mar. 30, 2010 (JP) ................................. 2010-076687

(51) Int. Cl.
*H01L 23/15* (2006.01)
*B32B 18/00* (2006.01)
(Continued)

(52) U.S. Cl.
CPC ............... *H01L 23/15* (2013.01); *B32B 18/00* (2013.01); *C04B 35/117* (2013.01); *C04B 35/16* (2013.01);
(Continued)

(58) Field of Classification Search
USPC ...................... 501/2, 11, 19, 53, 55
See application file for complete search history.

(56) References Cited

U.S. PATENT DOCUMENTS 5,256,469 A 10/1993 Cherukuri et al.
5,581,876 A * 12/1996 Prabhu et al. ................... 29/851
(Continued)

FOREIGN PATENT DOCUMENTS

JP 05-270934 A 10/1993
JP 05-286776 A 11/1993
(Continued)

OTHER PUBLICATIONS

Moriya et al., "Metal Base Substrate," U.S. Appl. No. 13/630,044, filed Sep. 28, 2012.
(Continued)

*Primary Examiner* — Colleen A Matthews
*Assistant Examiner* — William Harriston
(74) *Attorney, Agent, or Firm* — Keating & Bennett, LLP

(57) ABSTRACT

In a metal base substrate with a low-temperature sintering ceramic layer located on a copper substrate, bonding reliability is increased between the copper substrate and the low-temperature sintering ceramic layer. A raw laminated body is prepared by stacking, on a surface of a copper substrate, a low-temperature sintering ceramic green layer including a low-temperature sintering ceramic material containing about 10 mol % to about 40 mol % of barium in terms of BaO and about 40 mol % to about 80 mol % of silicon in terms of $SiO_2$, and this raw laminated body is subjected to firing at a temperature at which the low-temperature sintering ceramic green layer is sintered. In the thus obtained metal base substrate, a glass layer composed of Cu—Ba—Si based glass with a thickness of about 1 μm to about 5 μm is formed between the metal substrate and the low-temperature sintering ceramic layer.

17 Claims, 1 Drawing Sheet

(51) Int. Cl.
*C04B 35/117* (2006.01)
*C04B 35/16* (2006.01)
*C04B 35/195* (2006.01)
*C04B 37/02* (2006.01)
*C23C 24/08* (2006.01)
*C23C 28/04* (2006.01)
*H01L 23/14* (2006.01)
*H01L 23/498* (2006.01)
*H05K 1/05* (2006.01)

(52) U.S. Cl.
CPC ............ *C04B 35/195* (2013.01); *C04B 37/021* (2013.01); *C04B 37/025* (2013.01); *C23C 24/082* (2013.01); *C23C 28/04* (2013.01); *H01L 23/142* (2013.01); *H01L 23/49822* (2013.01); *H01L 23/49894* (2013.01); *H05K 1/053* (2013.01); *C04B 2235/3203* (2013.01); *C04B 2235/3206* (2013.01); *C04B 2235/3208* (2013.01); *C04B 2235/3215* (2013.01); *C04B 2235/3217* (2013.01); *C04B 2235/3262* (2013.01); *C04B 2235/3409* (2013.01); *C04B 2235/365* (2013.01); *C04B 2235/6025* (2013.01); *C04B 2235/652* (2013.01); *C04B 2235/656* (2013.01); *C04B 2235/6582* (2013.01); *C04B 2235/77* (2013.01); *C04B 2237/10* (2013.01); *C04B 2237/341* (2013.01); *C04B 2237/407* (2013.01); *C04B 2237/56* (2013.01); *C04B 2237/60* (2013.01); *C04B 2237/704* (2013.01); *C04B 2237/708* (2013.01); *H01L 2924/09701* (2013.01); *H01L 2224/16225* (2013.01); *H01L 2224/48227* (2013.01); *H01L 2224/73265* (2013.01); *H01L 2924/15192* (2013.01)
USPC ............... 156/89.12; 156/60; 156/89.11

(56) References Cited

U.S. PATENT DOCUMENTS

| 5,725,808 | A | * | 3/1998 | Tormey et al. | 252/514 |
| 5,866,240 | A | * | 2/1999 | Prabhu et al. | 428/210 |
| 5,958,807 | A | | 9/1999 | Kumar et al. | |
| 2001/0029228 | A1 | * | 10/2001 | Terashi | 501/32 |
| 2008/0289866 | A1 | | 11/2008 | Yuri et al. | |

FOREIGN PATENT DOCUMENTS

| JP | 10-107174 A | 4/1998 |
| JP | 10-167851 A | 6/1998 |
| JP | 11-511719 A | 10/1999 |
| JP | 11-514627 A | 12/1999 |
| JP | 2001-267443 A | 9/2001 |
| JP | 3226280 B2 | 11/2001 |
| JP | 2006-229214 A | 8/2006 |

OTHER PUBLICATIONS

Official Communication issued in International Patent Application No. PCT/JP2011/056913, mailed on Jul. 5, 2011.

* cited by examiner

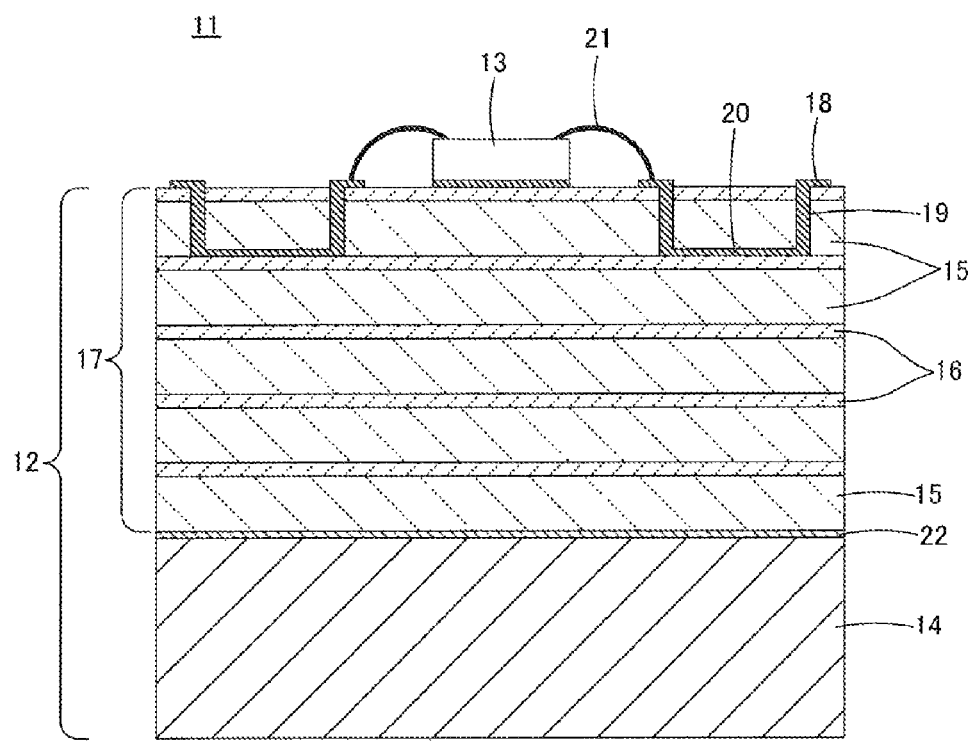

METAL BASE SUBSTRATE AND MANUFACTURING METHOD THEREOF

BACKGROUND OF THE INVENTION

1. Field of the Invention

The present invention relates to a metal base substrate which includes a semiconductor element and other elements mounted thereon and also provides a heat release function, and a method for manufacturing the metal base substrate, and more particularly, the present invention relates to a metal base substrate which has a metal substrate combined with a ceramic layer configured with the use of a low-temperature sintering ceramic material, and a method for manufacturing the metal base substrate.

2. Description of the Related Art

Metal base substrates have a relatively high heat release function, and have been used advantageously for mounting electronic components which require heat release, such as, for example, a semiconductor element. In the case of these metal base substrates, ceramic materials are used as a material constituting a substrate layer combined with a metal substrate.

For example, a low-temperature sintering ceramic material is a ceramic material which can be sintered at a temperature of 1050° C. or less. Therefore, as long as a metal base substrate has a ceramic layer configured with the use of the low-temperature sintering ceramic material and formed on a metal substrate, the raw low-temperature sintering ceramic layer and the metal substrate can be subjected to co-firing without using a metal substrate composed of a metal which has a very high melting point.

However, in the case of the metal base substrate as described above, it is important to keep the low-temperature sintering ceramic layer and the metal substrate from peeling during firing. Therefore, a joining glass layer is formed between the low-temperature sintering ceramic layer and the metal substrate. For example, Japanese Patent Unexamined Application Publication No. 5-270934, Japanese Translation of PCT International Application Publication No. 11-514627, and Japanese Translation of PCT International Application Publication No. 11-511719 disclose inventions which relate to a metal base substrate which is obtained by forming a joining glass layer on a metal substrate, and forming a low-temperature sintering ceramic layer thereon, and applying co-firing.

For the configuration according to the prior art, there is a need to form the joining glass layer in advance between the metal substrate and the low-temperature sintering ceramic layer. In the case of forming the joining glass layer in advance as just described, the joining glass layer has to be formed thickly in order to bind the metal substrate and the low-temperature sintering ceramic layer, and for example, Japanese Patent Unexamined Application Publication No. 5-270934 discloses the joining glass layer formed with a thickness of approximately 25 μm, whereas Japanese Translation of PCT International Application Publication No. 11-514627 discloses the joining glass layer formed with a thickness of approximately 35 μm. It is to be noted that Japanese Translation of PCT International Application Publication No. 11-511719 fails to disclose any specific thickness.

On the other hand, this joining glass layer is intended to function as a joining material, and thus a very weak layer in terms of flexure strength.

Moreover, when the joining glass layer is thick as described previously, flexure makes cracking more and more likely to be caused. This is because when the joining glass layer undergoes a deflection, the difference is further increased between stress caused on one principal surface side of the joining glass layer and stress caused on the other principal surface side thereof as the joining glass layer is thicker.

In addition, the prior art requires two firing steps including a firing step for forming the joining glass layer on the metal substrate; and a firing step after forming the low-temperature sintering ceramic green layer thereon, thereby resulting in a complicated process, and also requires a lot of energy for heating.

SUMMARY OF THE INVENTION

Therefore, preferred embodiments of the present invention provide a metal base substrate and a method for manufacturing the metal base substrate, which solve the problems as described above.

A preferred embodiment of the present invention provides a metal base substrate including a metal substrate, a glass layer located on the metal substrate, and a low-temperature sintering ceramic layer located on the glass layer, wherein the glass layer preferably has a thickness of about 1 μm to about 5 μm.

The metal base substrate according to a preferred embodiment of the present invention can be achieved by specific compositions such as that, for example, when the metal substrate has at least a surface containing therein a Cu constituent, the glass layer is composed of Cu—Ba—Si based glass, and the low-temperature sintering ceramic layer contains about 10 mol % to about 40 mol % of barium in terms of BaO and about 40 mol % to about 80 mol % of silicon in terms of $SiO_2$, for example.

According to another preferred embodiment of the present invention, a method for manufacturing a metal base substrate includes the steps of preparing a metal substrate with at least a surface containing a Cu constituent, preparing a raw laminated body by stacking, on a surface of the metal substrate, a low-temperature sintering ceramic green layer including a low-temperature sintering ceramic material containing about 10 mol % to about 40 mol % of barium in terms of BaO and about 40 mol % to about 80 mol % of silicon in terms of $SiO_2$; and firing the raw laminated body at a temperature at which the low-temperature sintering ceramic green layer is sintered.

The metal base substrate according to a preferred embodiment of the present invention includes the thin glass layer which has a relatively low strength, thus increasing the flexure strength, and therefore making the glass layer less likely to have cracking caused therein.

In addition, in the method for manufacturing a metal base substrate according to a preferred embodiment of the present invention, the glass layer can be formed between the metal substrate and the low-temperature sintering ceramic layer by forming and firing the low-temperature sintering ceramic green layer directly on the metal substrate without any joining glass layer separately formed in advance, and this glass layer joins the metal substrate and the low-temperature sintering ceramic layer. This glass layer preferably has a thickness in the range of about 1 μm to about 5 μm, for example, as described previously.

In the metal base substrate according to a preferred embodiment of the present invention, when the glass layer includes at least some of the constituents in at least the surface of the metal substrate and the constituents in the low-temperature sintering ceramic layer, the glass layer has substantially the same composition as the composition of the low-temperature sintering ceramic layer, thus making cracking less likely to be caused at the interface.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a cross-sectional view illustrating an electronic component device including a metal base substrate according to a preferred embodiment of the present invention.

DETAILED DESCRIPTION OF THE PREFERRED EMBODIMENTS

With reference to FIG. 1, first, an electronic component device will be described which includes a metal base substrate according to a preferred embodiment of the present invention.

The electronic component device 11 shown in FIG. 1 includes a metal base substrate 12 and a semiconductor element 13 mounted thereon.

The metal base substrate 12 includes a metal substrate 14, a glass layer 22 located on the metal substrate 14, and low-temperature sintering ceramic layers 15 located on the glass layer 22, and further includes constraining layers 16. The metal substrate 14 is joined to the low-temperature sintering ceramic layer 15 with the glass layer 22 interposed therebetween. In addition, the low-temperature sintering ceramic layers 15 and the constraining layers 16 are stacked alternately, and the uppermost layer is provided by the constraining layer 16. It is to be noted that the uppermost layer may be provided by the low-temperature sintering ceramic layer 15.

The low-temperature sintering ceramic layer 15 is thicker than the constraining layer 16. As will be evident from the subsequent description of a manufacturing method, the low-temperature sintering ceramic layers 15 preferably include a sintered body of a low-temperature sintering ceramic material. On the other hand, while the constraining layers 16 preferably include a poorly-sintering ceramic material which is not sintered at the sintering temperature of the low-temperature sintering ceramic material, the low-temperature sintering ceramic material contained in the low-temperature sintering ceramic layers 15 partially flows into the constraining layers 16 during firing, thereby solidifying and densifying the poorly-sintering ceramic material.

The glass layer 22 preferably has a thickness of about 1 μm to about 5 μm, for example.

In a laminated body section 17 including the low-temperature sintering ceramic layers 15 and the constraining layers 16 in the metal base substrate 12, a circuit pattern is provided. Although the illustration of some circuit patterns is omitted in FIG. 1, for example, some surface conductors 18, some interlayer connecting conductors 19, and some in-plane wiring conductors 20 are connected with the semiconductor element 13. In addition, a specific one of the surface conductors 18 is electrically connected to the semiconductor element 13 via a bonding wire 21.

In use, heat generated in the semiconductor element 13 is conducted through the laminated body section 17 to the metal substrate 14, and released from the metal substrate 14.

Preferably, the glass layer 22 preferably includes only the constituent of the metal substrate 14 and the constituent of the low-temperature sintering ceramic layer 15. More specifically, when the metal substrate 14 contains a Cu constituent as in the case of a copper plate, the glass layer 22 is preferably composed of Cu—Ba—Si based glass, and the low-temperature sintering ceramic layers 15 preferably contain about 10 mol % to about 40 mol % of barium in terms of BaO and about 40 mol % to about 80 mol % of silicon in terms of $SiO_2$.

It is to be noted that, as for the constituents contained in the metal substrate 14, the constituents in the surface of the metal substrate 14 have an influence on the constituents of the glass layer 22 as will be evident from the subsequent description of a manufacturing method, there is no need for the entire metal substrate 14 to be composed of a homogeneous material. For example, when there is a desire for a Cu constituent contained in the surface of the metal substrate 14, the Cu constituent may be contained only in the surface, such as a copper plate attached or copper plating applied onto the surface of a metal substrate other than a copper plate.

In addition, the glass layer 22 preferably contains no filler. This is because the joint strength is increased between the metal substrate 14 and the low-temperature sintering ceramic layer 15. While the flexure strength can be improved if the glass layer contains a filler, there is a reduced need to include a filler for the purpose of improving the flexure strength because the flexure strength is improved by reducing the thickness of the glass layer 22 to about 1 μm to about 5 μm, for example.

The metal base substrate 12 for use in this electronic component device 11 is preferably manufactured in the following way.

First, the metal substrate 14 is prepared, and also prepared respectively are a low-temperature sintering ceramic slurry containing the low-temperature sintering ceramic material and a poorly-sintering ceramic slurry containing the poorly-sintering ceramic material which is not sintered at the sintering temperature of the low-temperature sintering ceramic material. In this case, a substrate with at least a surface containing a Cu constituent is preferably prepared as the metal substrate 14. In addition, a material containing about 10 mol % to about 40 mol % of barium in terms of BaO and about 40 mol % to about 80 mol % of silicon in terms of $SiO_2$ is used as the low-temperature sintering ceramic material, for example.

Next, low-temperature sintering ceramic green layers composed of the low-temperature sintering ceramic slurry and poorly-sintering ceramic green layers composed of the poorly-sintering ceramic slurry are stacked on the metal substrate 14, thereby providing a raw laminated body corresponding to an unfired state of the metal base substrate 12. In this case, the low-temperature sintering ceramic green layers are intended to serve as the low-temperature sintering ceramic layers 15, whereas the poorly-sintering ceramic green layers are intended to serve as the constraining layers 16. In addition, the surface conductors 18, interlayer connecting conductors 19, and in-plane wiring conductors 20 are provided for specific ceramic green layers, if necessary or desired.

In carrying out the step mentioned above, preferably, a composite green sheet of a low-temperature sintering ceramic green layer overlapped with a poorly-sintering ceramic green layer is obtained by forming the poorly-sintering ceramic slurry into a sheet on a ceramic green sheet obtained through the formation of the low-temperature sintering ceramic slurry into a sheet, and the required number of this composite green sheet is then stacked on the metal substrate 14, and subjected to pressure bonding.

It is to be noted that in place of the method described above, low-temperature sintering ceramic green sheets obtained by forming the low-temperature sintering ceramic slurry into a shape and poorly-sintering ceramic green sheets obtained by forming the poorly-sintering ceramic slurry into a shape may be stacked alternately on the metal substrate 14. Alternatively, the formation of a poorly-sintering ceramic green layer and the formation of a low-temperature sintering ceramic green layer may be repeated on a low-temperature sintering ceramic green sheet.

Next, a step is carried out for co-firing the raw laminated body including the metal substrate 14, as well as the low-temperature sintering ceramic green layers and the poorly-sintering ceramic green layers. In this firing step, the low-temperature sintering ceramic material contained in the low-temperature sintering ceramic green layers is sintered to serve as the low-temperature sintering ceramic layers 15. In addition, this low-temperature sintering ceramic material partially flows into the poorly-sintering ceramic green layers to solidify the poorly-sintering ceramic material contained in the poorly-sintering ceramic green layers, and densify the poorly-sintering ceramic green layers to serve as the constraining layers 16.

The poorly-sintering ceramic green layers are not substantially shrunk in a planar direction in the firing step, and thus acts to significantly reduce and prevent the shrinkage of the low-temperature sintering ceramic green layers in the planar direction. Therefore, the shrinkage in the planar direction is advantageously prevented in the entire laminated body section composed of the low-temperature sintering ceramic green layers and the poorly-sintering ceramic green layers on the metal substrate 14.

In the metal base substrate 12 obtained in this way, the glass layer 22 with a thickness of about 1 μm to about 5 μm is formed between the metal substrate 14 and the low-temperature sintering ceramic layer 15, and this glass layer 22 achieves a favorable jointed state between the metal substrate 14 and the low-temperature sintering ceramic layer 15.

As described previously, the low-temperature sintering ceramic layer 15 preferably contains about 10 mol % to about 40 mol % of barium in terms of BaO and about 40 mol % to about 80 mol % of silicon in terms of $SiO_2$. On the other hand, the metal substrate 14 has at least a surface containing therein a Cu constituent. The glass layer 22 is derived from a reaction layer produced between the metal substrate 14 and the low-temperature sintering ceramic layer 15, thus composed of at least some of the constituents in at least the surface of the metal substrate 14 and the constituents in the low-temperature sintering ceramic layer 15, and therefore composed of Cu—Ba—Si based glass in this preferred embodiment. Further, the glass layer 22 may contain therein the constituents of the constraining layers 16.

While the low-temperature sintering ceramic layers 15 formed on the metal substrate 14 partially constitute the laminated body section 17 of the pluralities of low-temperature sintering ceramic layers 15 and constraining layers 16 stacked alternately in the preferred embodiment described above, the present invention can be applied to metal base substrates which have a structure of only low-temperature sintering ceramic layers provided on a metal substrate.

Next, non-limiting experimental examples will be described which were carried out in accordance with a preferred embodiment of the present invention.

Experimental Example 1

Respective powders of $BaCO_3$, $Al_2O_3$, and $SiO_2$ (quartz) were prepared, a mixed powder of these powders was subjected to calcination at a temperature of 840° C. for 120 minutes to a raw material powder, and this raw material powder and an $MnCO_3$ powder were mixed in an organic solvent with a dispersant added, and subsequently further mixed with the addition of a resin and a plasticizer to obtain a low-temperature sintering ceramic slurry including a low-temperature sintering ceramic material.

Table 1 shows the composition ratio of the inorganic solid content contained in this low-temperature sintering ceramic slurry. In Table 1, $BaCO_3$ is shown in terms of BaO, whereas $MnCO_3$ is shown in terms of MnO.

TABLE 1

| Sample Number | Composition [mol %] | | | |
|---|---|---|---|---|
| | BaO | $SiO_2$ | $Al_2O_3$ | MnO |
| 1 | 8.0 | 77.0 | 9.0 | 9.0 |
| 2 | 10.0 | 73.0 | 9.0 | 8.0 |
| 3 | 15.0 | 70.0 | 9.0 | 6.0 |
| 4 | 20.0 | 65.0 | 9.0 | 6.0 |
| 5 | 30.0 | 56.0 | 9.0 | 5.0 |
| 6 | 40.0 | 47.0 | 9.0 | 4.0 |
| 7 | 42.0 | 45.0 | 9.0 | 4.0 |
| 8 | 39.0 | 38.0 | 17.0 | 6.0 |
| 9 | 39.0 | 40.0 | 15.0 | 6.0 |
| 10 | 36.0 | 45.0 | 13.0 | 6.0 |
| 11 | 13.0 | 75.0 | 6.0 | 6.0 |
| 12 | 11.0 | 80.0 | 2.0 | 6.0 |
| 13 | 11.0 | 82.0 | 1.0 | 6.0 |
| 14 | 40.0 | 51.0 | 0 | 9.0 |

Next, after the low-temperature sintering ceramic slurry was subjected to defoaming, ceramic green sheets to serve as low-temperature sintering ceramic green layers of 40 μm in thickness were prepared by a doctor blade method.

On the other hand, a glass powder composed of $SiO_2$: 55.0 mol %, BaO: 20.0 mol %, MgO: 0.5 mol %, CaO: 5.5 mol %, $Al_2O_3$: 4.0 mol %, $B_2O_3$: 10.0 mol %, and $Li_2O$: 5.0 mol %, and an $Al_2O_3$ powder were mixed at a ratio of 40 parts by weight:60 parts by weight in an organic solvent with a dispersant added, and subsequently mixed with the addition of a resin and a plasticizer to obtain a poorly-sintering ceramic slurry including a poorly-sintering ceramic material.

Next, the poorly-sintering ceramic slurry was subjected to defoaming, and then, on the ceramic green sheets mentioned previously, the poorly-sintering ceramic slurry was formed by a doctor blade method into a sheet with a thickness of 4.0 μm. In this way, composite green sheets were obtained for which the low-temperature sintering ceramic green layer provided by the ceramic green sheet was overlapped with the poorly-sintering ceramic green layer formed from the poorly-sintering ceramic slurry.

It is to be noted that it has been confirmed that a ceramic compact obtained by forming the poorly-sintering ceramic slurry alone into a shape is not sintered even when the compact is subjected to firing under the firing condition described later.

Ten of the composite green sheets were stacked each on both surfaces of a copper plate composed of pure copper with a planar dimension of 30 $mm^2$ and a thickness of 0.8 mm, and pressed under the conditions of: temperature: 80° C. and pressure: 80 kgf/$cm^2$ for 300 seconds to prepare a first unfired sample for evaluation. In this case, the stacking was carried out so that the low-temperature sintering ceramic green layer side of the composite green sheet was brought into contact with the copper plate, whereas the poorly-sintering ceramic green layer was exposed at both principal surfaces of the sample for evaluation.

Next, the first unfired sample for evaluation was subjected to degreasing in a nitrogen neutral atmosphere, and then to firing at the top temperature shown in the column "Firing Temperature" of Table 2 in a nitrogen/hydrogen reducing atmosphere, thereby providing a first sample for evaluation.

Except that composite green sheets each with a conductor pattern of 4 mm² in planar dimension formed in the same position with the use of a copper paste so as to constitute a capacitor were used as the seventh and eighth composite green sheets from the copper plate side at the stage of stacking the composite green sheets in the process of preparing the first sample for evaluation, a second sample for evaluation was obtained through the same operation as in the case of the first sample for evaluation.

As shown in Table 2, evaluated were the "Planar Porosity", the "Interface Bonding", and the "Insulation Reliability".

The planar porosity was obtained for evaluating the sinterability, in such a way that a cross section of the first sample for evaluation was polished to observe the ceramic section at 1000-fold magnification with the use of a scanning electron microscope (SEM), and measure the planar porosity by image analysis. For each sample, 10 fields of view were subjected to the image analysis, and the average values are shown in Table 2.

A cross section of the first sample for evaluation was polished to observe whether or not there was cracking caused at an interface section between the copper plate and the ceramic section at 5000-fold magnification with the use of a SEM. For each sample, 30 fields of view were observed, and the interface bonding was determined to be favorable with "◯" shown in Table 2 if no cracking was caused at all, whereas the interface bonding was determined to be defective with "x" shown in Table 2 if cracking was caused even in one field of view.

The second sample for evaluation was used to carry out a test under the conditions of temperature: 121° C., humidity: 100%, voltage applied between conductor patterns: 100 DCV, and test time: 300 hours. The resistance value after the test was measured at measurement voltage: 100 DCV. This measurement result is shown in Table 2.

TABLE 2

| | | Substrate Characteristics | | |
|---|---|---|---|---|
| Sample Number | Firing Temperature [° C.] | Planar Porosity [%] | Interface Bonding | Insulation Reliability log IR [Ω] |
| 1 | 980 | 95 | x | 11.9 |
| 2 | 980 | 97 | ◯ | 12.5 |
| 3 | 980 | 98 | ◯ | 13.4 |
| 4 | 980 | 98 | ◯ | 11.7 |
| 5 | 980 | 97 | ◯ | 10.8 |
| 6 | 980 | 98 | ◯ | 10.3 |
| 7 | 980 | 97 | ◯ | 8.5 |
| 8 | 980 | 96 | ◯ | 8.1 |
| 9 | 980 | 97 | ◯ | 10.2 |
| 10 | 980 | 97 | ◯ | 10.8 |
| 11 | 980 | 98 | ◯ | 13.2 |
| 12 | 1000 | 96 | ◯ | 11.5 |
| 13 | 1000 | 90 | ◯ | 6.2 |
| 14 | 980 | 97 | ◯ | 11.6 |

As for the compositions shown in Table 1, in the case of samples 2 to 6, 9 to 12, and 14 which satisfy the conditions of about 10 mol % to about 40 mol % of BaO and about 40 mol % to about 80 mol % of $SiO_2$, favorable results are achieved for all of the "Porosity", "Interface Bonding", and "Insulation Reliability" as shown in Table 2. For these samples, the cross sections were analyzed by wavelength-dispersive X-ray spectroscopy (WDX) and it was confirmed that a glass layer of about 1 μm to about 5 μm in thickness was produced at the bonded interface between the copper plate and the low-temperature sintering ceramic layer. In addition, it was confirmed that respective elements of Cu, Ba, Si, and Al are present in the glass layers of samples 2 to 6 and 9 to 12. In the glass layer of sample 14, Al is not present although it was confirmed that respective elements of Cu, Ba, and Si are present therein.

In contrast to these samples, in the case of sample 1 with BaO less than about 10 mol %, the "Interface Bonding" is "x". On the other hand, in the case of sample 7 with BaO greater than about 40 mol %, the "Insulation Reliability" is low.

In addition, in the case of sample 8 with $SiO_2$ less than about 40 mol %, the "Insulation Reliability" is low. On the other hand, in the case of sample 13 with $SiO_2$ greater than about 80 mol %, the "Planar Porosity" is low, and the "Insulation Reliability" is low.

It is to be noted that, among the compositions shown in Table 1, $Al_2O_3$ is added for increasing the chemical durability and the flexural strength, but an optional constituent which needs not be contained. In addition, it was confirmed that the additive amount thereof greater than about 25 mol % leads to defective sintering. In addition, while MnO is intended to function as a sintering aid, and may be supposed to replace with the glass, it was confirmed that the additive amount thereof greater than about 14 mol % leads to a decrease in strength.

Experimental Example 2

Respective powders of $BaCO_3$, $Al_2O_3$, $SiO_2$ (quartz), and $H_3BO_3$ were prepared, a mixed powder of these powders was subjected to calcination at a temperature of 840° C. for 120 minutes to a raw material powder, and this raw material powder was mixed in an organic solvent with a dispersant added, and subsequently further mixed with the addition of a resin and a plasticizer to obtain low-temperature sintering ceramic slurry including a low-temperature sintering ceramic material.

Table 3 shows the composition ratio of the inorganic solid content contained in this low-temperature sintering ceramic slurry. In Table 3, $BaCO_3$ is shown in terms of BaO, whereas $H_3BO_3$ is shown in terms of $B_2O_3$.

TABLE 3

| Sample Number | Composition [mol %] | | | |
|---|---|---|---|---|
| | BaO | $SiO_2$ | $Al_2O_3$ | $B_2O_3$ |
| 21 | 8.0 | 78.0 | 9.0 | 5.0 |
| 22 | 12.0 | 75.0 | 9.0 | 4.0 |
| 23 | 16.0 | 72.0 | 9.0 | 3.0 |
| 24 | 30.0 | 58.5 | 9.0 | 2.5 |
| 25 | 38.0 | 51.0 | 9.0 | 2.0 |
| 26 | 42.0 | 47.0 | 9.0 | 2.0 |
| 27 | 39.0 | 38.0 | 20.0 | 3.0 |
| 28 | 38.0 | 42.0 | 18.0 | 3.0 |
| 29 | 30.0 | 54.0 | 13.0 | 3.0 |
| 30 | 20.0 | 66.0 | 11.0 | 3.0 |
| 31 | 13.0 | 78.0 | 6.0 | 3.0 |
| 32 | 11.0 | 82.0 | 4.0 | 3.0 |

Next, after the low-temperature sintering ceramic slurry was subjected to defoaming, ceramic green sheets to serve as low-temperature sintering ceramic green layers of about 40 μm in thickness were prepared by a doctor blade method.

On the other hand, a glass powder composed of $SiO_2$: 55.0 mol %, BaO: 20.0 mol %, MgO: 0.5 mol %, CaO: 5.5 mol %, $Al_2O_3$: 4.0 mol %, $B_2O_3$: 10.0 mol %, and $Li_2O$: 5.0 mol %, and an $Al_2O_3$ powder were mixed at a ratio of 35 parts by weight:65 parts by weight in an organic solvent with a dispersant added, and subsequently mixed with the addition of a resin and a plasticizer to obtain a poorly-sintering ceramic slurry including a poorly-sintering ceramic material.

Next, the poorly-sintering ceramic slurry was subjected to defoaming, and then, on the ceramic green sheets mentioned previously, the poorly-sintering ceramic slurry was formed by a doctor blade method into a sheet with a thickness of 3.0 µm. In this way, composite green sheets were obtained for which the low-temperature sintering ceramic green layer provided by the ceramic green sheet was overlapped with the poorly-sintering ceramic green layer formed from the poorly-sintering ceramic slurry.

It is to be noted that it was confirmed that a ceramic compact obtained by forming the poorly-sintering ceramic slurry alone into a shape is not sintered even when the compact is subjected to firing under the firing condition described later.

Through the same operation as in the case of Experimental Example 1, a first sample for evaluation and a second sample for evaluation were obtained.

The "Planar Porosity", the "Interface Bonding", and the "Insulation Reliability" were evaluated by the same methods as in the case of Experimental Example 1, as shown in Table 4.

TABLE 4

| Sample Number | Firing Temperature [° C.] | Substrate Characteristics | | |
|---|---|---|---|---|
| | | Planar Porosity [%] | Interface Bonding | Insulation Reliability log IR [Ω] |
| 21 | 980 | 97 | x | 12.1 |
| 22 | 980 | 98 | ○ | 12.1 |
| 23 | 980 | 97 | ○ | 12.9 |
| 24 | 980 | 97 | ○ | 12.8 |
| 25 | 980 | 96 | ○ | 11.0 |
| 26 | 980 | 96 | ○ | 8.8 |
| 27 | 980 | 96 | ○ | 7.9 |
| 28 | 980 | 96 | ○ | 10.9 |
| 29 | 980 | 97 | ○ | 12.3 |
| 30 | 980 | 98 | ○ | 12.5 |
| 31 | 1000 | 96 | ○ | 11.1 |
| 32 | 1000 | 89 | ○ | 5.9 |

The same evaluation results were achieved as in the case of Experimental Example 1.

More specifically, as for the compositions shown in Table 3, in the case of samples 22 to 25 and 28 to 31 which satisfy the conditions of 10 to 40 mol % of BaO and 40 to 80 mol % of $SiO_2$, favorable results are achieved for all of the "Porosity", "Interface Bonding", and "Insulation Reliability" as shown in Table 4. For these samples, the cross sections were analyzed by wavelength-dispersive X-ray spectroscopy (WDX) and it was confirmed that a glass layer of about 1 µm to about 5 µm in thickness was produced at the bonded interface between the copper plate and the low-temperature sintering ceramic layer, and respective elements of Cu, Ba, Si, and Al present in the glass layer.

In contrast to these samples, in the case of sample 21 with BaO less than about 10 mol %, the "Interface Bonding" is "x". On the other hand, in the case of sample 26 with BaO greater than about 40 mol %, the "Insulation Reliability" is low.

In addition, in the case of sample 27 with $SiO_2$ less than about 40 mol %, the "Insulation Reliability" is low. On the other hand, in the case of sample 32 with $SiO_2$ greater than about 80 mol %, the "Planar Porosity" is low, and the "Insulation Reliability" is low.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A metal base substrate comprising:
   a metal substrate;
   a glass layer that is about 1 µm to about 5 µm thick and located on the metal substrate; and
   a low-temperature sintering ceramic layer located on the glass layer; wherein the glass layer comprises Cu—Ba—Si based glass.

2. The metal base substrate according to claim 1, wherein the glass layer comprises at least constituents in at least a surface of the metal substrate and constituents in the low-temperature sintering ceramic layer.

3. The metal base substrate according to claim 1, wherein the metal substrate includes at least a surface containing a Cu constituent.

4. The metal base substrate according to claim 1, wherein the low-temperature sintering ceramic layer contains about 10 mol % to about 40 mol % of barium in terms of BaO and about 40 mol % to about 80 mol % of silicon in terms of $SiO_2$.

5. The metal base substrate according to claim 1, further comprising a constraining layer stacked on the low-temperature sintering ceramic layer.

6. The metal base substrate according to claim 5, wherein the low-temperature sintering ceramic layer is thicker than the constraining layer.

7. The metal base substrate according to claim 1, further comprising a laminated body section including the low-temperature sintering ceramic layer, a constraining layer, and a circuit pattern.

8. An electronic component device comprising:
   a metal base substrate; and
   a semiconductor element; wherein
   the metal base substrate includes:
      a metal substrate;
      a glass layer that is about 1 µm to about 5 µm thick and located on the metal substrate; and
      a low-temperature sintering ceramic layer located on the glass layer; and
   the glass layer comprises Cu—Ba—Si based glass.

9. The electronic component device according to claim 8, wherein the glass layer comprises at least constituents in at least a surface of the metal substrate and constituents in the low-temperature sintering ceramic layer.

10. The electronic component device according to claim 8, wherein the metal substrate includes at least a surface containing a Cu constituent.

11. The electronic component device according to claim 8, wherein the low-temperature sintering ceramic layer contains about 10 mol % to about 40 mol % of barium in terms of BaO and about 40 mol % to about 80 mol % of silicon in terms of $SiO_2$.

12. The electronic component device according to claim 8, wherein the metal base substrate further comprises a constraining layer stacked on the low-temperature sintering ceramic layer.

13. The electronic component device according to claim 12, wherein the low-temperature sintering ceramic layer is thicker than the constraining layer.

14. The electronic component device according to claim 8, further comprising a laminated body section including the low-temperature sintering ceramic layer, a constraining layer, and a circuit pattern.

15. The electronic component device according to claim 8, further comprising surface conductors, interlayer connecting conductors, and in-plane wiring conductors connected with the semiconductor element.

16. The electronic component device according to claim 15, further comprising a bonding wire arranged to electrically connect one of the surface conductors to the semiconductor element.

17. A method for manufacturing a metal base substrate, the method comprising the steps of:
   preparing a metal substrate including at least a surface containing a Cu constituent;
   preparing a raw laminated body by stacking, on a surface of the metal substrate, a low-temperature sintering ceramic green layer comprising a low-temperature sintering ceramic material containing about 10 mol % to about 40 mol % of barium in terms of BaO and about 40 mol % to about 80 mol % of silicon in terms of $SiO_2$; and
   firing the raw laminated body at a temperature at which the low-temperature sintering ceramic green layer is sintered; wherein
   a glass layer composed of Cu—Ba—Si based glass with a thickness of about 1 μm to about 5 μm is formed between the metal substrate and the low-temperature sintering ceramic layer.

* * * * *